(12) United States Patent
Liao et al.

(10) Patent No.: US 10,971,602 B2
(45) Date of Patent: Apr. 6, 2021

(54) HIGH-K METAL GATE PROCESS AND DEVICE

(71) Applicant: Taiwan Semiconductor Manufacturing Co., Ltd., Hsinchu (TW)

(72) Inventors: Chien-Shun Liao, New Taipei (TW); Huai-Tei Yang, Hsinchu (TW); Chun Chieh Wang, Kaohsiung (TW); Yueh-Ching Pai, Taichung (TW); Chun-I Wu, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/852,819

(22) Filed: Apr. 20, 2020

(65) Prior Publication Data

US 2020/0251574 A1    Aug. 6, 2020

Related U.S. Application Data

(62) Division of application No. 16/145,382, filed on Sep. 28, 2018, now Pat. No. 10,629,700.

(51) Int. Cl.
*H01L 21/28* (2006.01)
*H01L 29/49* (2006.01)
*H01L 29/78* (2006.01)
*H01L 21/8234* (2006.01)
*H01L 29/51* (2006.01)
*H01L 29/66* (2006.01)

(52) U.S. Cl.
CPC .. *H01L 29/66545* (2013.01); *H01L 21/28088* (2013.01); *H01L 21/823431* (2013.01); *H01L 29/4966* (2013.01); *H01L 29/513* (2013.01); *H01L 29/518* (2013.01); *H01L 29/66795* (2013.01); *H01L 29/7851* (2013.01)

(58) Field of Classification Search
CPC . H01L 29/4232; H01L 29/49; H01L 29/4966; H01L 29/513; H01L 29/517; H01L 29/518
See application file for complete search history.

(56) References Cited

U.S. PATENT DOCUMENTS

| | | |
|---|---|---|
| 9,418,853 B1 | 8/2016 | Wang et al. |
| 2013/0241003 A1 | 9/2013 | Lin et al. |
| 2016/0233092 A1 | 8/2016 | Lin et al. |
| 2020/0105602 A1* | 4/2020 | Wu .............. H01L 21/823864 |

* cited by examiner

*Primary Examiner* — Robert G Bachner
*Assistant Examiner* — Molly K Reida
(74) *Attorney, Agent, or Firm* — Slater Matsil, LLP

(57) ABSTRACT

An embodiment is a method of semiconductor processing. The method includes depositing a high-k gate dielectric layer over a semiconductor fin. A barrier layer is deposited over the high-k gate dielectric layer. A silicon passivation layer is deposited over the barrier layer. A nitrogen treatment is performed on the silicon passivation layer. A capping layer is deposited over the silicon passivation layer. The capping layer is annealed.

20 Claims, 16 Drawing Sheets

HIGH-K METAL GATE PROCESS AND DEVICE

PRIORITY CLAIM AND CROSS-REFERENCE

This application is a divisional of U.S. application Ser. No. 16/145,382, now U.S. Pat. No. 10,629,700, filed on Sep. 28, 2018, which application is hereby incorporated herein by reference.

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. Such scaling down has increased the complexity of processing and manufacturing ICs. For these advances to be realized, similar developments in IC manufacturing are needed.

As the semiconductor IC industry has progressed into nanometer technology process nodes in pursuit of higher device density, higher performance, and lower costs, challenges from both fabrication and design have resulted in the development of three-dimensional (3D) devices, such as fin field effect transistors (FinFETs). Advantages of FinFET devices include reducing the short channel effect and increasing the current flow. There has been a desire to use a FinFET device with a high-k gate dielectric and a metal gate electrode to improve device performance as feature sizes continue to decrease.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
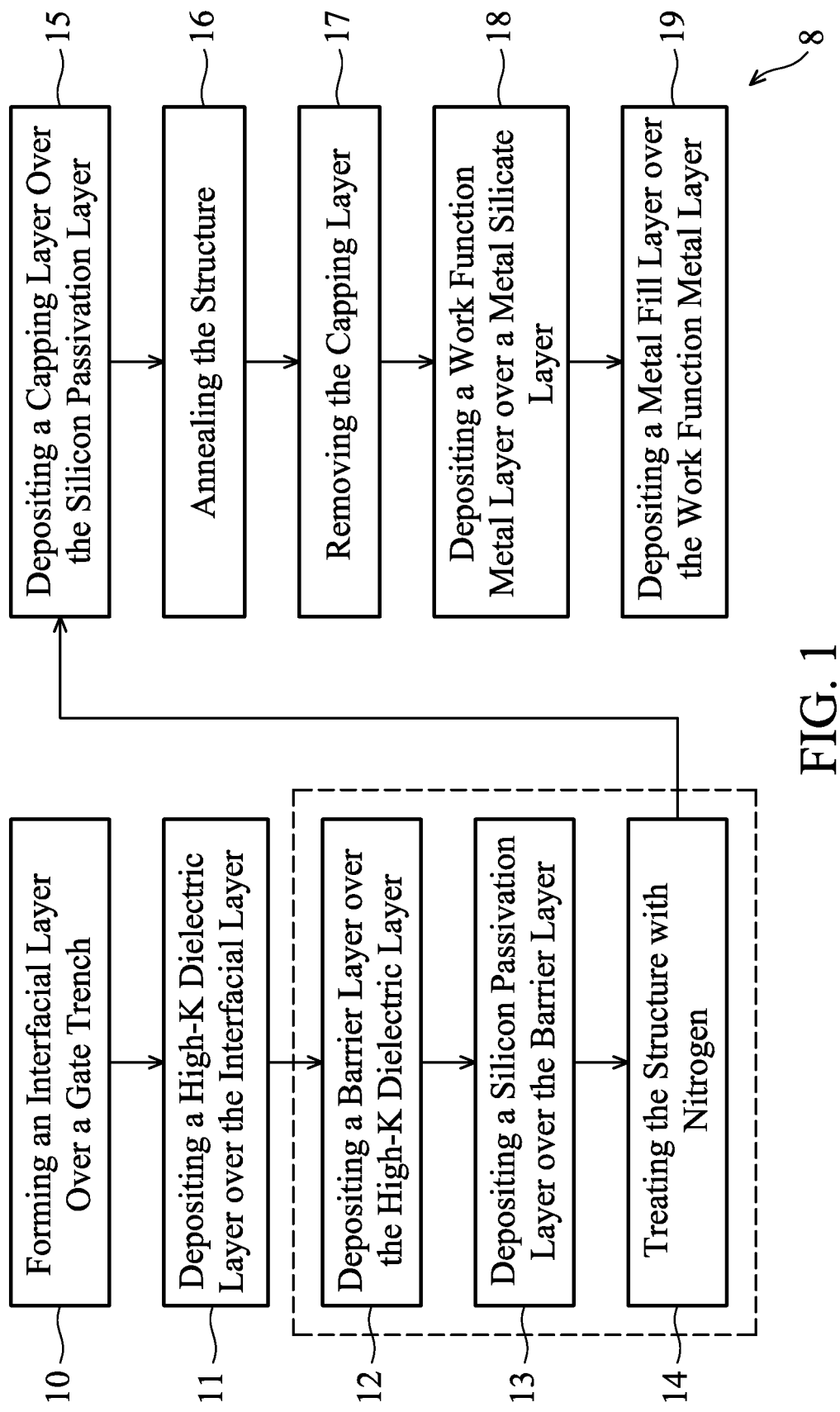
FIG. 1 is a flow diagram illustrating a process of manufacturing a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

High-k metal gate structures, including a high-k dielectric layer and a metal gate, are used to increase circuit performance. Some embodiments are described in the context of a replacement gate process. Implementations of some aspects may be used in other processes. For example, other example processes can include a gate-first process.

Some embodiments are described in the context of FinFETs. The fins of FinFETs may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. Implementations of some aspects may be used in other devices. For example, other devices include Horizontal Gate All Around (HGAA) FETs, Vertical Gate All Around (VGAA) FETs, nanowire channel FETs, and other devices.

Some variations of the example processes, structures, and devices are described. A person having ordinary skill in the art will readily understand other modifications that may be made that are contemplated within the scope of other embodiments. Although process embodiments may be described in a particular order, various other process embodiments may be performed in any logical order and may include fewer or more operations than what is described herein.

A metal gate structure may include a gate dielectric layer, a barrier layer over the gate dielectric layer, a work function metal layer over the barrier layer, and a gate metal fill over the work function metal layer. Some embodiments described herein are directed to providing a device, and a method of forming the same, in which the device includes a metal silicate layer. The metal silicate layer is formed through passivation or forming a silicon passivation layer over the barrier layer using a silicon precursor and through annealing the metal gate structure. In certain embodiments, the metal gate structure exhibits an increase in dielectric value along with a boost in device performance.

Figure 2:
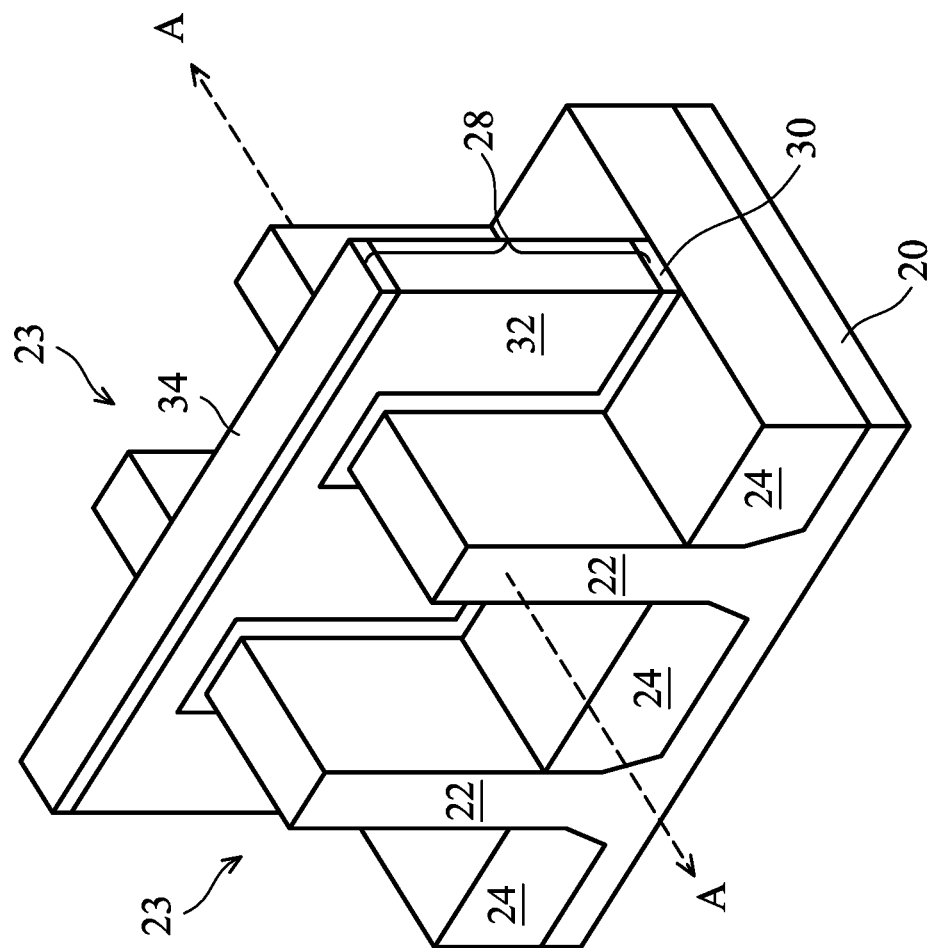
FIG. 2 is a schematic perspective view of a semiconductor substrate at one stage of manufacturing a semiconductor device with a dummy gate structure in accordance with some embodiments.

FIG. 1 depicts an exemplary flow diagram of a process 8 performed to form a high-k metal gate structure, such as described with respect to FIG. 2 to FIG. 15. FIG. 2 is a schematic perspective view and FIG. 3 to FIG. 15 are schematic cross-sectional views of a portion of the substrate corresponding to various stages of the process 8 in accordance with some embodiments. The process 8 may be utilized to form any suitable structures, including the structures depicted in FIG. 2 to FIG. 15 or in other applicable semiconductor structures.

As shown in FIG. 2, the structure includes a substrate 20. The substrate 20 can be or include a bulk semiconductor substrate, a semiconductor-on-insulator (SOI) substrate, or another substrate. The semiconductor material of the substrate 20 can include or be a material selected from at least one of silicon (e.g., crystalline silicon like Si<100> or Si<111>), silicon germanium, germanium, gallium arsenide, or another semiconductor material. The semiconductor material may be doped or undoped, such as with a p-type or an n-type dopant. In some embodiments wherein a SOI structure is utilized for the substrate 20, the substrate 20 may include semiconductor material disposed on an insulator layer, which may be a buried insulator disposed in a semiconductor substrate, or which may be a glass or sapphire substrate. In certain embodiments, the substrate 20 is a silicon wafer. For example, the substrate 20 may be a round substrate having a 150 mm diameter, 200 mm diameter, a 300 mm diameter, a 450 mm diameter, or other diameters. In other embodiments, the substrate 20 may be any particular size, shape, or materials. For example, the substrate 20 may also be any polygonal, square, rectangular, curved, or otherwise non-circular workpiece.

The structure includes one or more semiconductor fins, referred to herein as fin structures 22. Each fin structure 22 provides an active region where one or more electronic circuits are formed. The fin structures 22 are fabricated using suitable processes including masking, photolithography, and/or etch processes. An etch process forms recesses 23 into the substrate, leaving an extending fin, such as the fin structures 22. The recesses 23 may be etched using reactive ion etch (RIE) and/or other suitable processes. Numerous other embodiments of methods to form a fin structure on a substrate may be utilized. For example, a fin structure can be epitaxially grown in trenches and can have a general structure similar to what is shown in the figures.

In certain embodiments, the fin structures 22 comprise silicon materials or another elementary semiconductor, such as germanium, or a compound semiconductor including silicon carbide, gallium arsenic, gallium phosphide, indium phosphide, indium arsenide, and/or indium antimonide. The fin structures 22 may also be an alloy semiconductor including SiGe, GaAsP, AlInAs, AlGaAs, GaInAs, GaInP, GaInAsP, or a combination thereof. The fin structures 22 may be doped using n-type and/or p-type dopants as needed.

The recesses 23 may be filled with a dielectric material that is etched back to form isolation structures 24. Other fabrication processes for the isolation structures 24 and/or the fin structure 22 are possible. The isolation structures 24 may isolate some regions of the substrate 20, e.g., active areas in the fin structures 22. In certain embodiments, the isolation structures 24 may be shallow trench isolation (STI) structures and/or other suitable isolation structures. The STI structures may be formed of silicon oxide, silicon nitride, silicon oxynitride, fluoride-doped silicate glass (FSG), a low-k dielectric material, and/or other suitable insulating material. The STI structures may include a multi-layer structure, for example, having one or more layers.

A dummy gate structure 28 is formed over the fin structures 22. In the example depicted in FIG. 2, the dummy gate structure 28 includes an interfacial dielectric layer 30, a dummy gate layer 32, and a hardmask layer 34. The dummy gate structure 28 may further include a capping layer and/or other suitable layers. The various layers in the dummy gate structure 28 may be formed by suitable deposition processes and patterned by suitable photolithography and etching processes. The dummy gate structure 28 engages the fin structures 22 on the sides and top of the fin structure 22. The term "dummy", as used here, refers to a sacrificial structure which will be removed in a later stage and will be replaced with another structure, such as a high-k gate dielectric layer and a metal gate in a replacement gate process. The replacement gate process refers to manufacturing a gate structure at a later stage of the overall gate manufacturing process.

The interfacial dielectric layer 30 can be a dielectric oxide layer. For example, the dielectric oxide layer may be formed by chemical oxidation, thermal oxidation, atomic layer deposition (ALD), chemical vapor deposition (CVD), and/or other suitable methods. The dummy gate layer 32 may be a poly-silicon layer or other suitable layers. For example, the dummy gate layer 32 may be formed by suitable deposition processes such as low-pressure CVD (LPCVD) and plasma-enhanced CVD (PECVD). The hardmask layer 34 may be any material suitable to pattern the dummy gate structure 28 with desired features/dimensions on the substrate.

In certain embodiments, the various layers of the dummy gate structure 28 are first deposited as blanket layers. The blanket layers are patterned through a process including photolithography and etching processes, removing portions of the blanket layers and keeping the remaining portions over the isolation structures 24 and the fin structures 22 to form the dummy gate structure 28.

In certain embodiments, the structure may be in a p-type device region for forming one or more p-type devices, or an n-type device region for forming one or more n-type devices. The structure may be included in an integrated circuit such as logic devices, memory devices, and/or other ICs.

Figure 3:
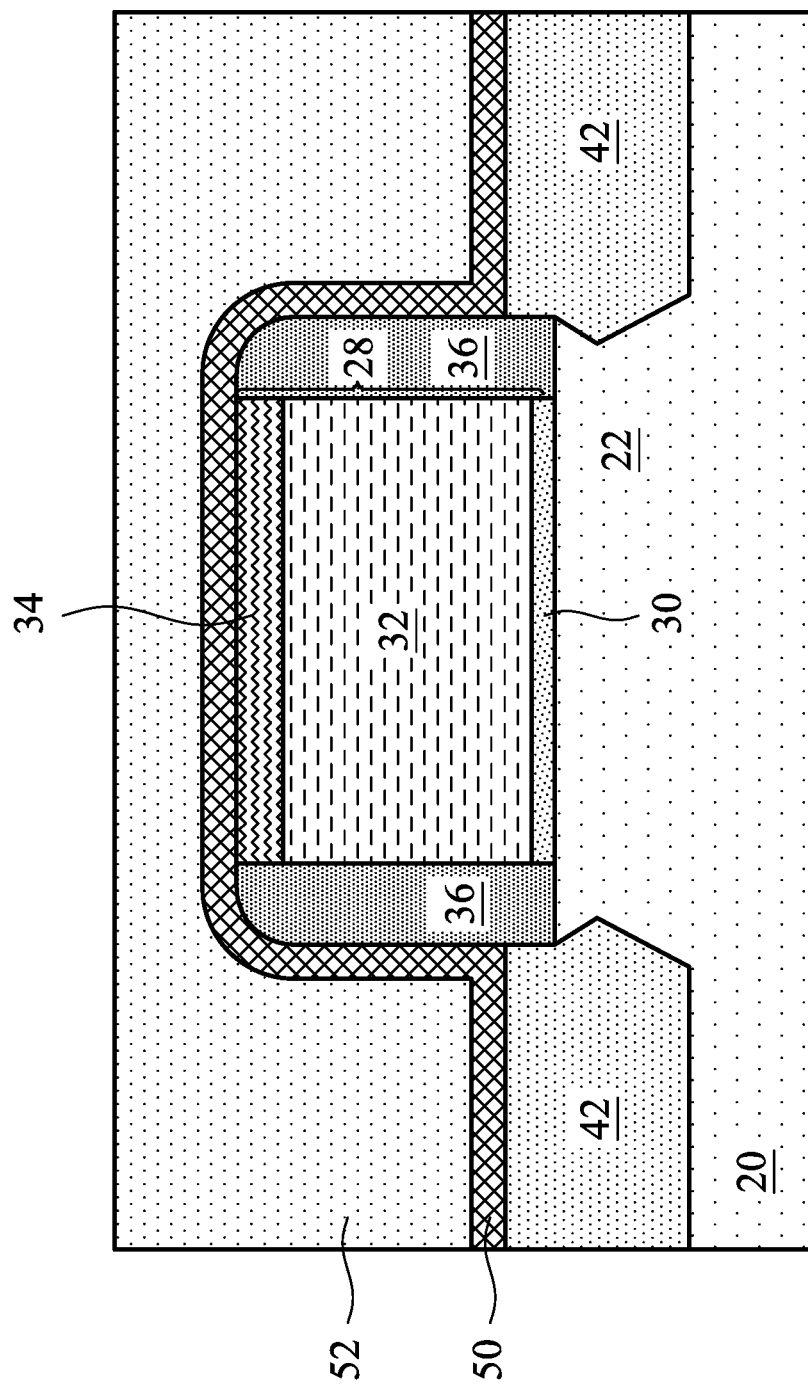
FIGS. 3-15 are schematic cross-section views of a semiconductor substrate at various stages of manufacturing a high-k metal gate structure in accordance with some embodiments.

In certain embodiments, a spacer feature 36 is formed on sidewalls of the dummy gate structure 28, as shown in FIG. 3. FIG. 3 illustrates a cross-sectional view along the line A-A through one of the fin structures 22 of FIG. 2. The spacer feature 36 includes a material different from the material(s) for the dummy gate structure 28. The spacer feature 36 includes a dielectric material, such as silicon nitride or silicon oxynitride. The spacer feature 36 may be a single layer or multiple layers. In certain embodiments, after the dummy gate structure 28 is formed, one or more spacer layers are formed by conformally depositing spacer materials over the structure. An anisotropic etching process is performed to remove portions of the spacer layers to form the spacer feature 36, as depicted in FIG. 3.

After the spacer feature 36 is formed, one or more epitaxial growth processes may be performed to grow epitaxy source/drain regions 42. The epitaxy source/drain regions 42 may be formed in recesses of the fin structure 22 or over non-recessed fin structures (not shown). The epitaxial growth process may in-situ dope the epitaxy source/drain regions with a p-type dopant for forming a p-type device or an n-type dopant for forming an n-type device.

Subsequently, an interlayer dielectric (ILD) 52 is formed over the substrate 20 and over the spacer feature 36. In certain embodiments, the structure may further include a contact etch stop layer 50 underneath the ILD 52 and over the spacer feature 36. The ILD 52 may include materials such as a silicon oxide (e.g., such as a silicon oxide formed by tetraethylorthosilicate (TEOS)), un-doped silicate glass, doped silicon oxide such as borophosphosilicate glass (BPSG), fluoride-doped silicate glass (FSG), phosphosilicate glass (PSG), boron doped silicon glass (BSG), and/or other suitable dielectric materials. The ILD 52 may be deposited by a PECVD process, high density plasma CVD (HDPCVD) process, or other suitable deposition processes. The ILD 52 is formed to at least fill the recesses 23 between neighboring dummy gate structures 28.

Figure 4:
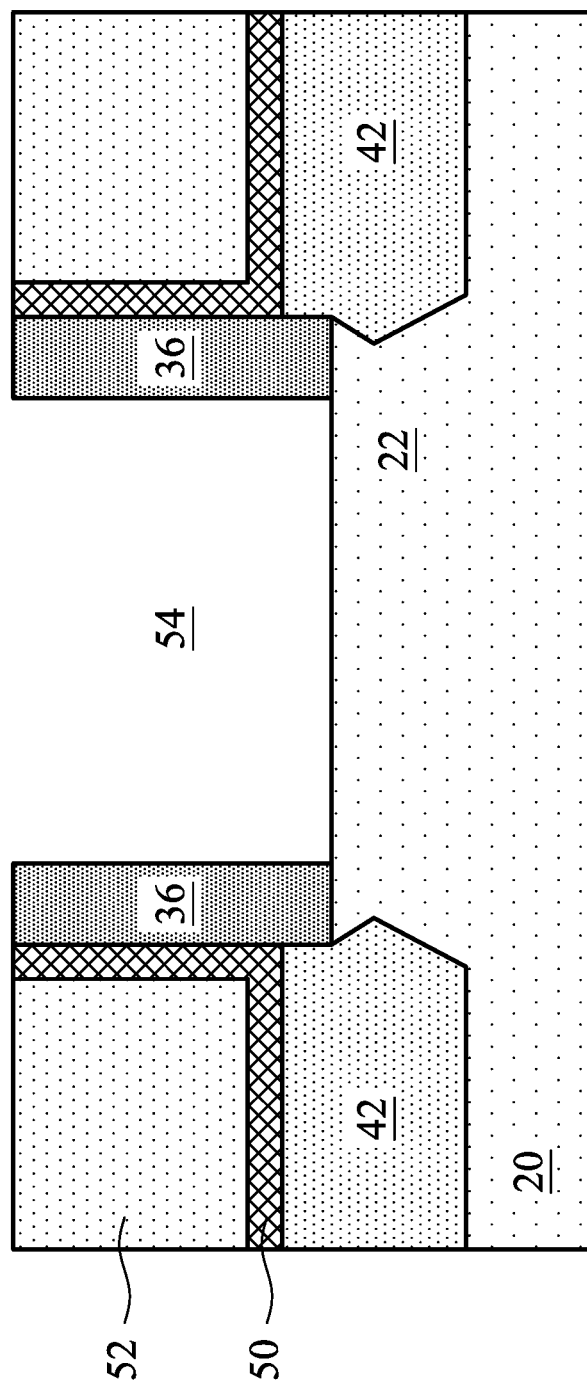

A chemical mechanical planarization (CMP) process is performed to planarize the ILD 52 and the spacer feature 36 to expose the dummy gate structure 28, and, once exposed, the dummy gate structure 28 is removed from the substrate 20 to define a gate trench 54 in the ILD 52 as shown in FIG. 4. The gate trench 54 exposes a surface of the isolation structures 24 (not visible in the cross-section of FIG. 4) and surfaces of the fin structure 22. The dummy gate structure 28 may be removed using an etch process, such as a dry (plasma) etch, a wet etch, and/or other suitable etch processes. For example, a dry etching process may use chlorine-containing gases, fluorine-containing gases, other etching gases, or a combination thereof. The wet etching solutions may include HF (hydrofluoric acid), TMAH (tetramethylammonium hydroxide), other suitable wet etching solutions, or combinations thereof.

Figure 5:
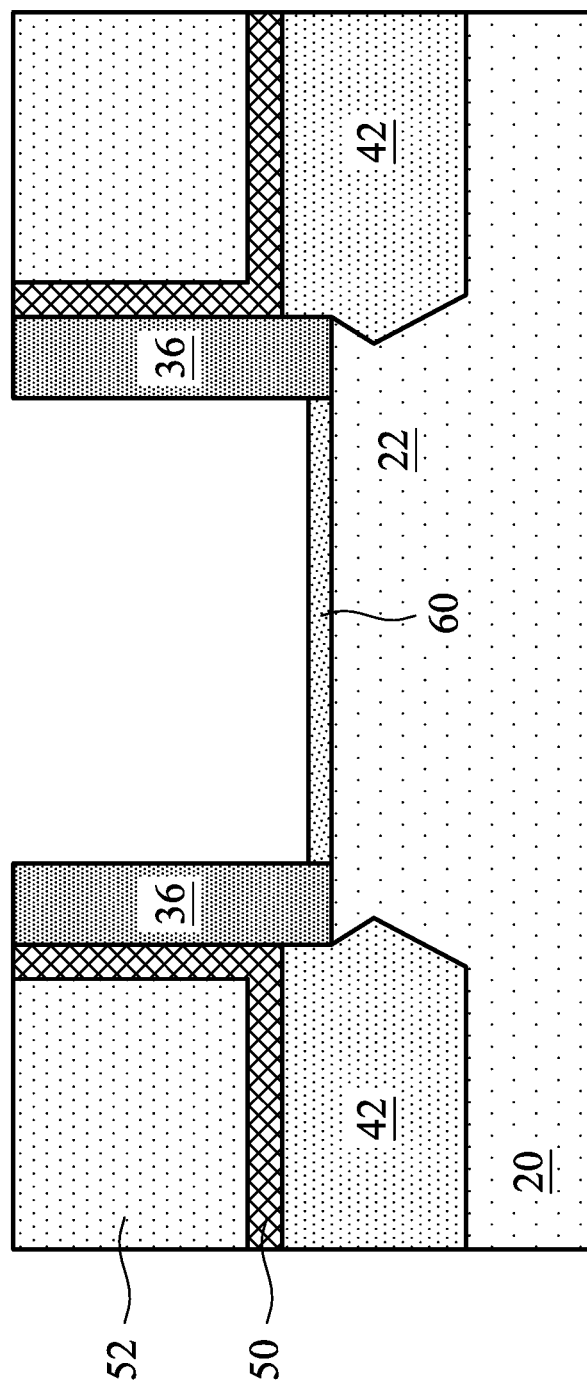

At operation 10 of the process 8 of FIG. 1, an interfacial layer 60 is formed over the gate trench 54 as shown in FIG. 5. In certain embodiments, the interfacial layer 60 may include a dielectric material such as a silicon oxide layer ($SiO_2$), a silicon oxynitride (SiON) layer, and the like. The interfacial layer 60 may be formed by chemical oxidation, thermal oxidation, ALD, CVD, and/or other suitable processes. The interfacial layer 60 maybe formed to an initial thickness in a range from about 5 Å to about 10 Å. Although the interfacial layer 60 as depicted in FIG. 5 as being formed over the fin structure 22, the interfacial layer 60 may be also formed along sidewalls of the spacer features 36.

Figure 6:
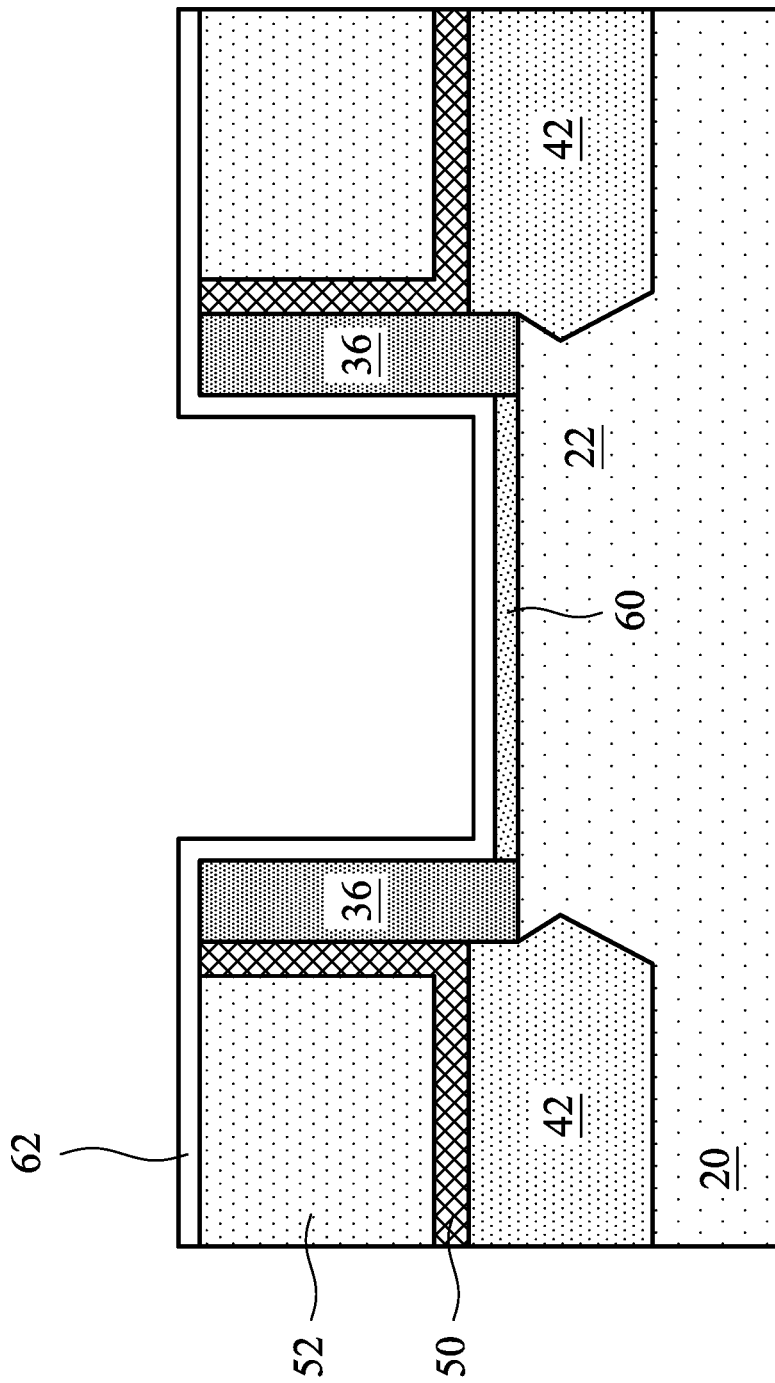

At operation 11 of the process 8 of FIG. 1, a high-k gate dielectric layer 62 is deposited over the interfacial layer 60 as shown in FIG. 6. The high-k gate dielectric layer 62 comprises a metal oxide material having a high-k dielectric constant. For example, the high-k gate dielectric layer 62 may comprise hafnium oxide ($HfO_x$), $AlO_x$, lanthanum oxide ($LaO_x$), $TiO_x$, $HfZr_xO_y$, $HfSi_xO_y$, $ZrO_x$, $ZrSi_xO_y$, $TaO_x$, YO, $SrTi_xO_y$, $BaTi_xO_y$ (BTO), $BaZr_xO_y$, $HfZr_xO_y$, $HfZr_xO_yN_z$, $HfLa_xO_y$, $HfSi_xO_y$, $HfSi_xO_yN_z$, $LaSi_xO_y$, $AlSi_xO_y$, $HfTa_xO_y$, $HfTi_xO_y$, $(Ba,Sr)Ti_xO_y$ (BST), combinations thereof, or other suitable material. In certain embodiments, the high-k gate dielectric layer 62 comprises $LaO_x$, $LaSi_xO_y$, $HfLa_xO_y$, or combinations thereof. The high-k gate dielectric layers 62 may be formed by ALD, CVD, and/or other suitable methods. In other embodiments, the high-k gate dielectric layer 62 may be directly formed on the substrate 20 (e.g., on the fin structure 22) when the interfacial layer 60 is not present.

Figure 7:
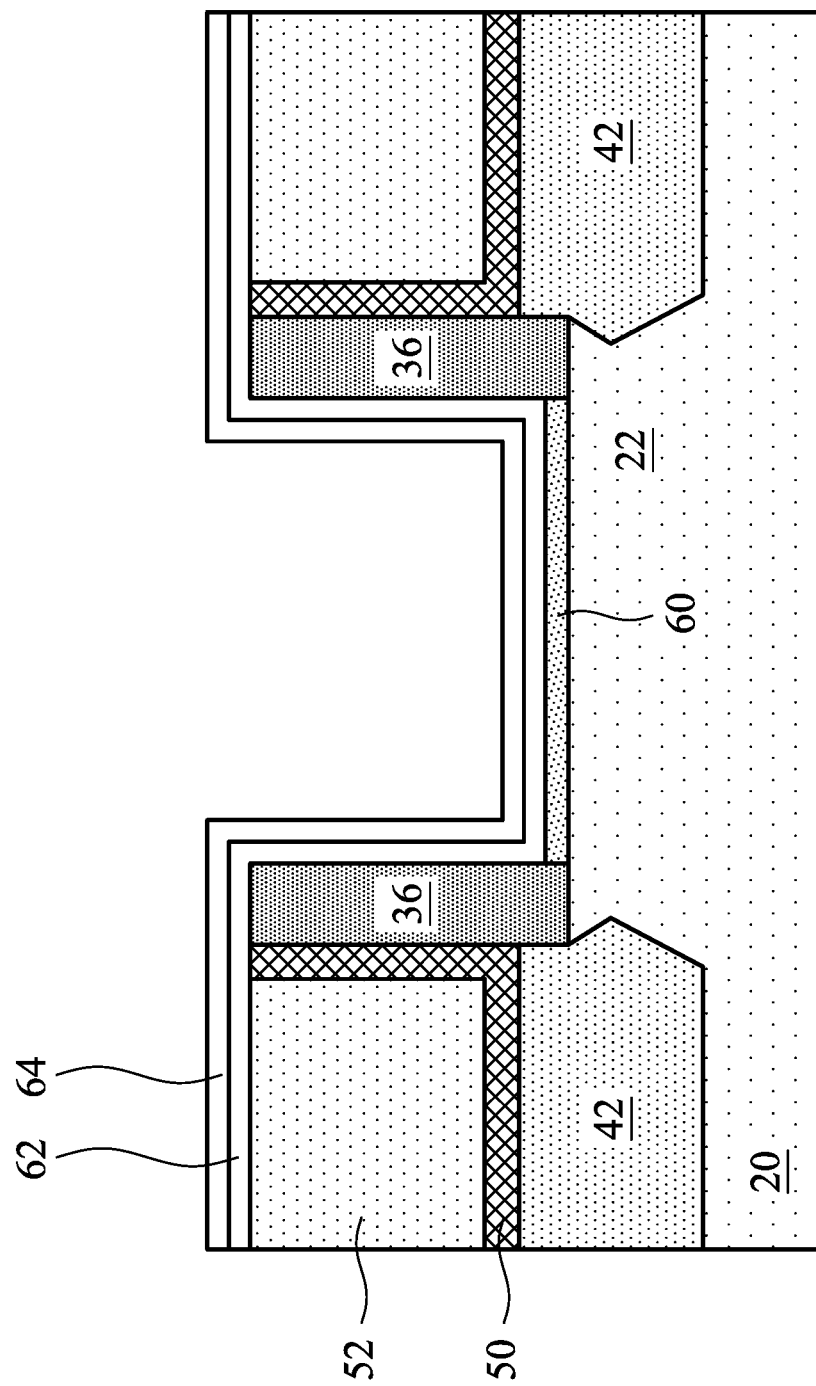

At operation 12 of the process 8 of FIG. 1, a barrier layer 64 is deposited over the high-k gate dielectric layer 62 as shown in FIG. 7. The barrier layer 64 comprises titanium nitride (TiN), tantalum nitride (TaN), multiple layers thereof, or other suitable materials. In certain embodiments, the barrier layer 64 may have a thickness in a range from about 5 angstroms to about 20 angstroms. The barrier layer 64 may be conformally deposited, such as by CVD processes, including PECVD, metal-organic CVD (MOCVD), ALD, cyclic deposition, or other suitable deposition processes.

In certain embodiments, the barrier layer 64 may be a TiN layer deposited by cyclic deposition, such as by ALD. In cyclic deposition, multiple cycles of precursors are flowed to a surface of a substrate to deposit a layer thereover. Each cycle includes providing a pulse of a titanium precursor, such as titanium chloride ($TiCl_4$), and a pulse of a nitrogen precursor, such an ammonia gas ($NH_3$), to form TiN. In certain embodiments, the titanium precursor is provided at a flow rate in a range from about 50 sccm to about 150 sccm. In certain embodiments, the nitrogen precursor is provided at a flow rate in a range from about 50 sccm to about 150 sccm. In certain embodiments, the cyclic deposition is conducted at a pressure in a range from about 1 torr to about 15 torr, such as in a range from about 4 torr to about 8 torr.

A pulse of a purge gas between the pulses of the titanium precursor and the nitrogen precursor may help to remove excess titanium precursor and nitrogen precursor on the surface of the substrate to help provide controlled growth. Instead of a pulse of a purge gas, a pump down of sufficient duration between the pulse of the titanium precursor and the pulse of the nitrogen precursor may be used to help to remove excess titanium precursor and nitrogen precursor on the surface of the substrate to help provide controlled growth. In certain embodiments, a plasma may also be provided. For example, the pulse of a nitrogen precursor may be provided as a plasma. In certain embodiments, each cycle may form about a monolayer or atomic layer of titanium nitride. In other embodiments, each cycle may form less than a monolayer due to partial adsorption or partial reaction of the titanium precursor and the nitrogen precursor. In other embodiments, each cycle may form more than a monolayer due to only partial or no removal of excess titanium precursor and nitrogen precursor on the surface of the substrate.

In other embodiments, other titanium precursors may be used instead of or in combination with $TiCl_4$, such as titanium iodide ($TiI_4$), titanium bromide ($TiBr_4$), tetrakis (dimethylamido) titanium (TDMAT), tetrakis (diethylamido) titanium (TDEAT), tetrakis (diethylamido) titanium (TDEAT), and other suitable titanium precursors. In other embodiments, other nitrogen precursors may be used instead of or in combination with ammonia, such as hydrazine ($N_2H_4$), monomethyl hydrazine ($CH_3N_2H_3$), dimethyl hydrazine ($C_2H_6N_2H_2$), t-butylhydrazine ($C_4H_9N_2H_3$), phenylhydrazine ($C_6H_5N_2H_3$), 2,2'-azoisobutane (($CH_3)_6C_2N_2$), ethylazide ($C_2H_5N_3$), nitrogen ($N_2$), other suitable nitrogen precursors, and combinations thereof.

Figure 8:
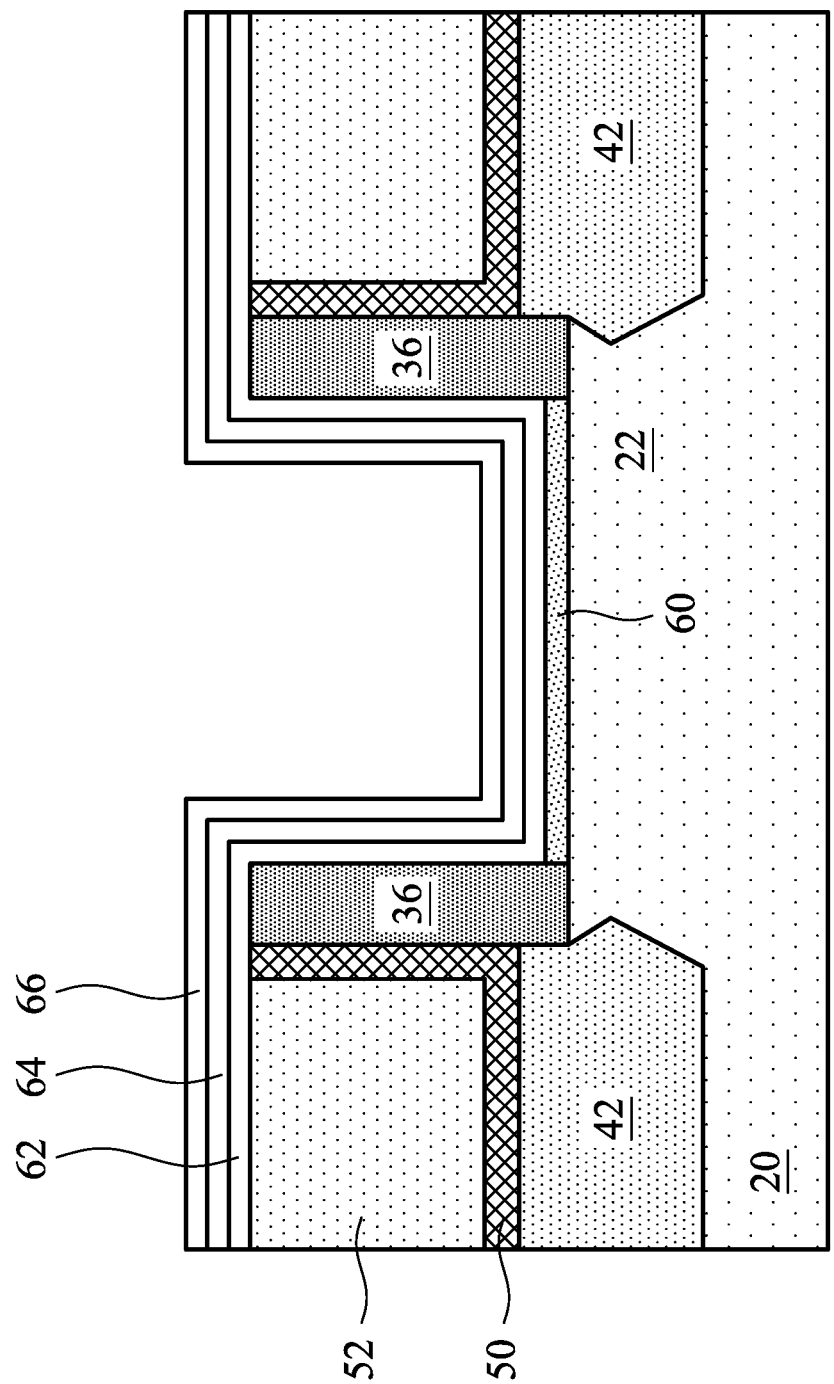

At operation 13 of the process 8 of FIG. 1, a silicon passivation layer 66 is deposited over the barrier layer 64 as shown in FIG. 8. In certain embodiments, the silicon passivation layer 66 comprises of silicon or hydrogenated silicon. The silicon passivation layer 66 may be deposited by soaking the structure with a silicon precursor to deposit silicon by thermal decomposition, plasma decomposition, or other suitable deposition processes. The silicon precursor may be silane, disilane, trisilane, combinations thereof, or other suitable silicon precursors. In certain embodiments, the silicon passivation layer 66 is deposited to a thickness in a range from about 0.5 Å to about 15 Å, such as in a range from about 3 Å and about 10 Å. The silicon passivation layer 66 helps to protect the barrier layer 64. If the silicon passivation layer 66 is too thin, then oxygen may diffuse through the passivation layer 66 to the layers below, such as the barrier layer 64, the gate dielectric layer 62, and/or the interfacial layer 60. If oxygen diffuses into the interfacial layer 60, the properties of the structure may be adversely impacted, such as altering a threshold voltage Vt of a transistor that is formed. If silicon passivation layer 66 is too thick, then the silicon passivation layer 66 may adversely impact the nitrogen precursor treatment of operation 14 by inhibiting the penetration of nitrogen to the layers below.

In certain embodiments, the silicon precursor is provided at a flow rate in a range from about 300 sccm to about 500 sccm. In some embodiments, an additional process gas and/or carrier gas may also be provided, such as hydrogen gas. In certain embodiments, the soak is performed at a temperature in a range from about 400° C. to about 600° C. If a temperature lower than 400° C. is used during the silicon precursor soak, the silicon precursor may not sufficiently decompose to form a silicon layer over the barrier layer 64. For example, the formation of a silicon passivation layer of silicon or hydrogenated silicon may form by the following reaction in formula (I):

$$SiH_4 (g) \rightarrow Si (s) + 2H_2 (g) \quad (I)$$

If a temperature higher than 600° C. is used during the silicon precursor soak, it may be difficult to control the deposition rate of the silicon material. In certain embodiments, a silicon precursor is provided at a flow rate for a duration in a range from about 2 minutes to about 10 minutes.

Figure 9:
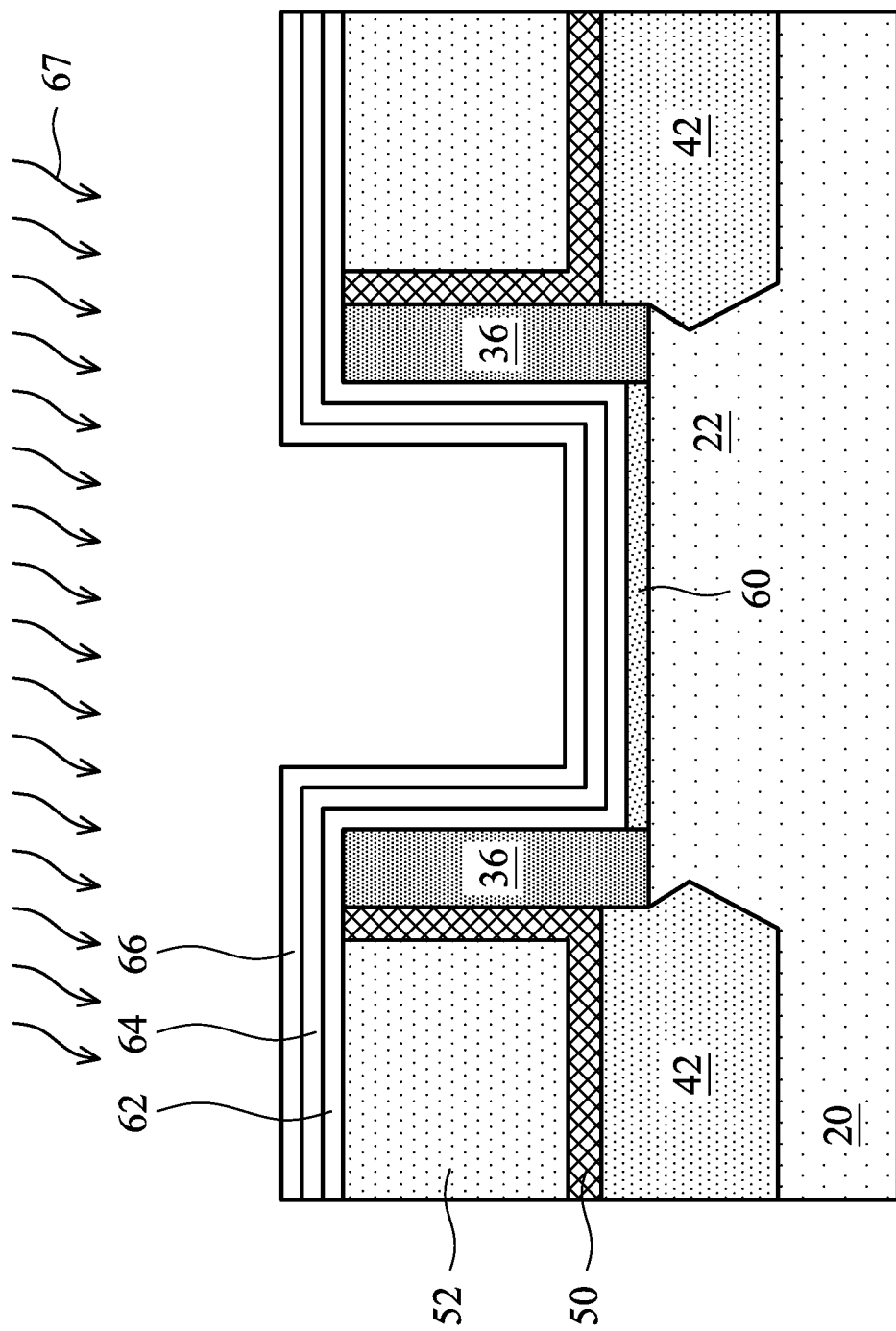

At operation 14 of the process 8 of FIG. 1, the structure is treated with nitrogen, referred to herein as a nitrogen treatment 67, as shown in FIG. 9. The nitrogen treatment 67 comprises flowing a nitrogen precursor to the structure. The nitrogen precursor may be ammonia, hydrazine ($N_2H_4$), nitrogen gas, other suitable nitrogen-containing and oxygen-free precursors, and combinations thereof. In certain embodiments, the nitrogen precursor is provided at a flow rate in a range from about 5 slm to about 15 slm, such as in a range from about 7 slm to about 11 slm. In certain embodiments, the nitrogen treatment is a post-metal anneal (PMA) performed at a temperature in a range from about 700° C. to about 1,000° C. In certain embodiments, the nitrogen treatment is provided in a two-operation post-metal anneal process. In certain aspects, a post metal anneal process performed in two or more operations reduces damage to the semiconductor devices of the semiconductor substrate due to overshooting of the intended anneal temperature. For example, a first operation comprises a first anneal at a temperature in a range from about 700° C. to about 800° C. and a second operation comprises a second anneal at a temperature higher than the first anneal, such as a second anneal at a temperature in a range from about 850° C. to about 930° C. In another example, the first operation comprises a first anneal at a temperature in a range from about 700° C. to about 800° C. at a pressure in a range from about 40 torr to about 50 torr, and the second operation comprises a second anneal at a temperature in a range from about 850° C. to about 930° C. at a pressure in a range from about 1 torr to about 10 torr.

In certain aspects, the nitrogen treatment 67 is conducted at a certain temperature and certain pressure to provide a thermal nitridation of the structure to cause the nitrogen to penetrate into the barrier layer 64, the gate dielectric layer 62, and/or the interfacial layer 60. If the temperature and/or the pressure of the nitrogen treatment is too low, an insufficient amount of nitrogen may dissociate from the nitrogen precursor to penetrate into the layers of the structure. If the temperature of the nitrogen treatment is too high, the structure may be damaged. If the pressure of the nitrogen treatment is too high, the nitrogen precursor may be wasted due to low residence time to the structure. In other embodiments, a plasma nitridation of the structure in which a nitrogen plasma is provided to the structure may be performed alternatively or in combination with a thermal nitridation.

In certain embodiments, the nitrogen treatment 67 passivates the barrier layer 64, the high-k gate dielectric layer 62, and/or the interfacial layer 60. Dangling bonds and charge trapping sites may be present within the barrier layer 64, the high-k gate dielectric layer 62, and/or the interfacial layer 60 and may be present at the interfaces between the barrier layer 64, the high-k gate dielectric layer 62, and/or the interfacial layer 60. Introduction of nitrogen from the nitrogen treatment 67 can passivate the dangling bonds and eliminate some of the charge trapping sites that otherwise would exist. In certain embodiments, the nitrogen treatment 67 drives in nitrogen from the nitrogen precursor and/or from the barrier layer 64 comprising a metal nitride, such as titanium nitride, into the high-k gate dielectric layer 62 and into the interfacial layer 60. In certain embodiments, the nitrogen treatment 67 drives in nitrogen from the nitrogen precursor into the barrier layer 64 comprising a metal nitride, such as titanium nitride, and densifies the barrier layer 64 to enhance the barrier properties of the barrier layer 64.

In certain embodiments, operations 12, 13, and 14 are performed within the same integrated process system without exposing the structure to the ambient environment or to air. In some embodiments, operation 12 and operation 13 may be performed in the same processing chamber, or in-situ with one process recipe to perform the operation 12 to deposit the barrier layer 64 and another process recipe to perform the operation 13 to deposit the silicon passivation layer 66. In some embodiments, operation 14 may be performed in a rapid thermal processing (RTP) chamber so that the high temperature of operation 14 may be quickly achieved. In other embodiments, the operation 14 of a nitrogen treatment of the structure is performed first, and then the operation 13 is performed to deposit the silicon passivation layer 66.

Figure 10:
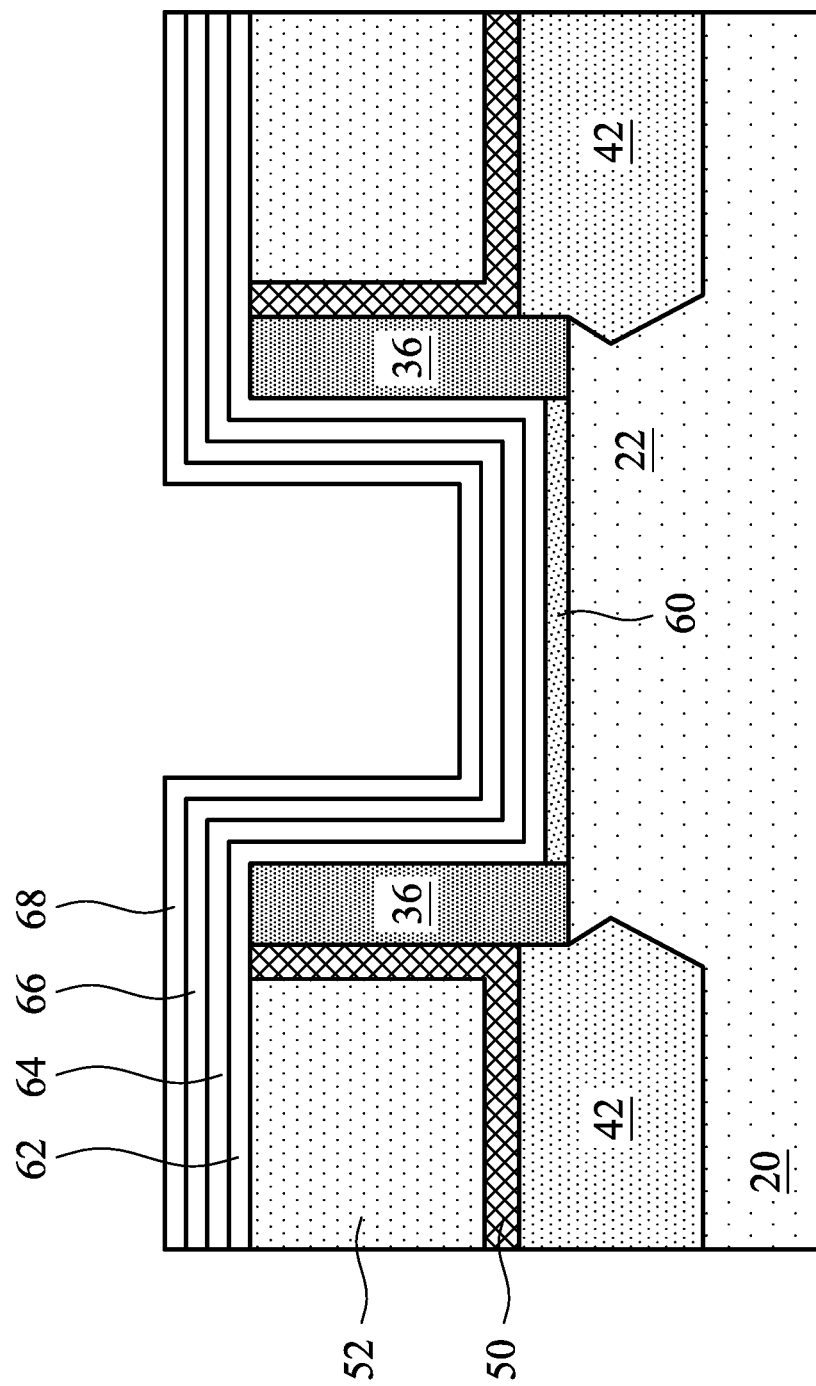

At operation 15 of the process 8 of FIG. 1, a capping layer 68 is deposited over the silicon passivation layer 66 as shown in FIG. 10. The capping layer 68 may comprise silicon, other suitable materials, or combinations. In certain embodiments, the capping layer 68 comprises silicon or hydrogenated silicon is deposited by using a silicon precursor, such as silane, disilane, or combinations thereof, by thermal decomposition, plasma decomposition, or other suitable deposition processes. The formation of a capping layer 68 of silicon or hydrogenated silicon may form by formula (I) above. In certain embodiments, the capping layer 68 is formed to a thickness in a range from about 20 Å to about 40 Å. In certain embodiments, the capping layer 68 provides additional protection of the barrier layer 64 in addition to the protection from the silicon passivation layer 66 from exposure to the ambient environment or to air.

Figure 11:
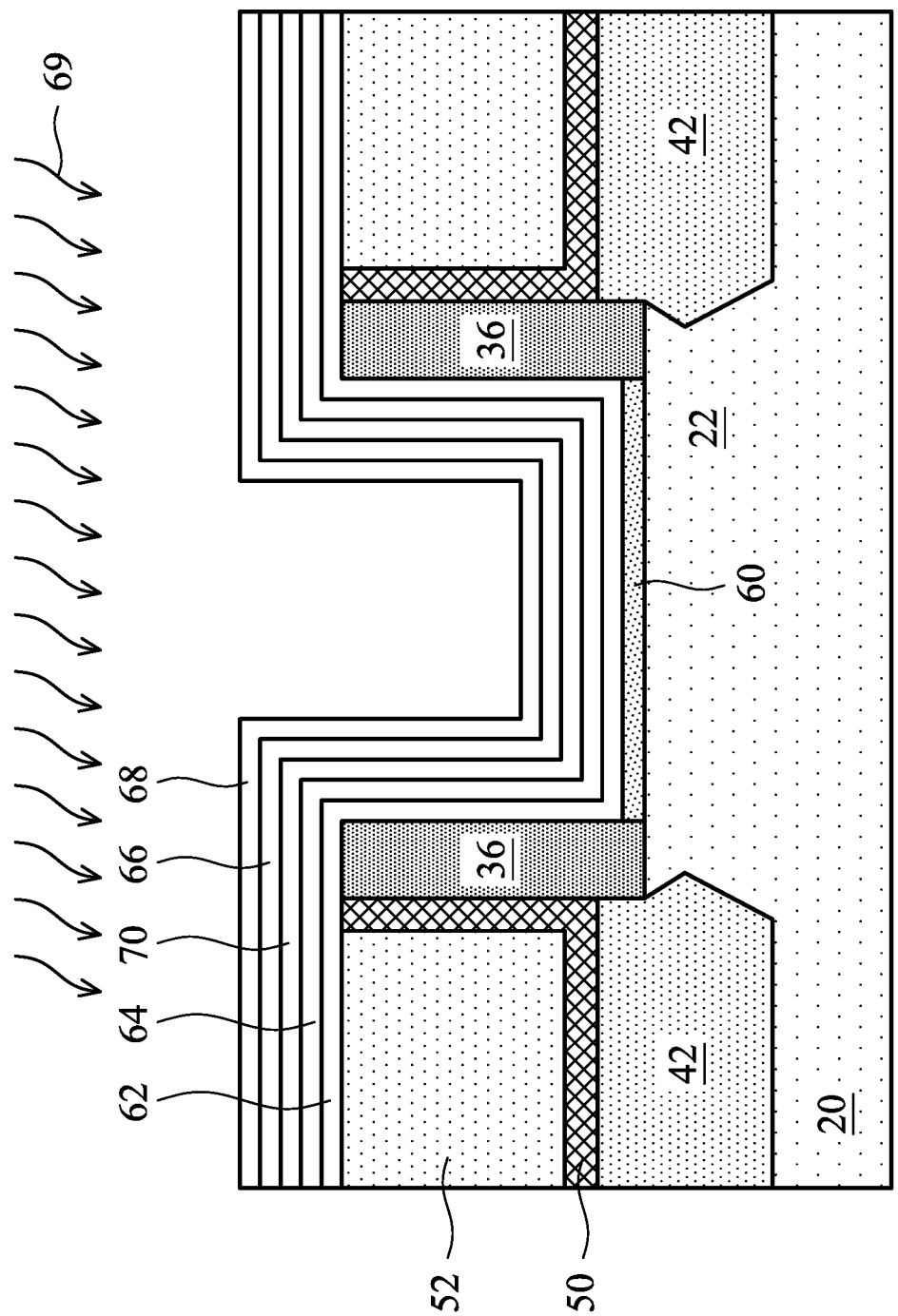

At operation 16 of the process 8 of FIG. 1, an anneal 69, such as a post capping layer anneal, of the structure of FIG. 10 is performed as shown in FIG. 11. In certain embodiments, the anneal is performed at a temperature in a range from about 800° C. to about 1,000° C. The anneal 69 may be performed in an RTP chamber. In certain embodiments, the anneal 69 causes weakly bonded oxygen in the interfacial layer 60, the high-k gate dielectric layer 62, and/or the barrier layer 64 to be scavenged and absorbed by the silicon passivation layer 66, and/or the capping layer 68. The oxygen diffuses out of the interfacial layer 60, the high-k gate dielectric layer 62, and/or the barrier layer 64 to react with the silicon passivation layer 66 and/or the capping layer 68. In certain embodiments, the anneal 69 causes the silicon passivation layer 66 and/or the capping layer 68 to absorb oxygen from the interfacial layer 60 reducing the thickness of the interfacial layer. The thickness of the interfacial layer 60 may be reduced by more than 30% from an initial thickness. A thinner interfacial layer 60 helps to improve the transistor characteristics. In certain embodiments, a thinner interfacial layer 60 in combination with the high-k gate dielectric layer 62 provides better threshold voltage $V_t$ performance of a high-k metal gate structure.

Figure 15:
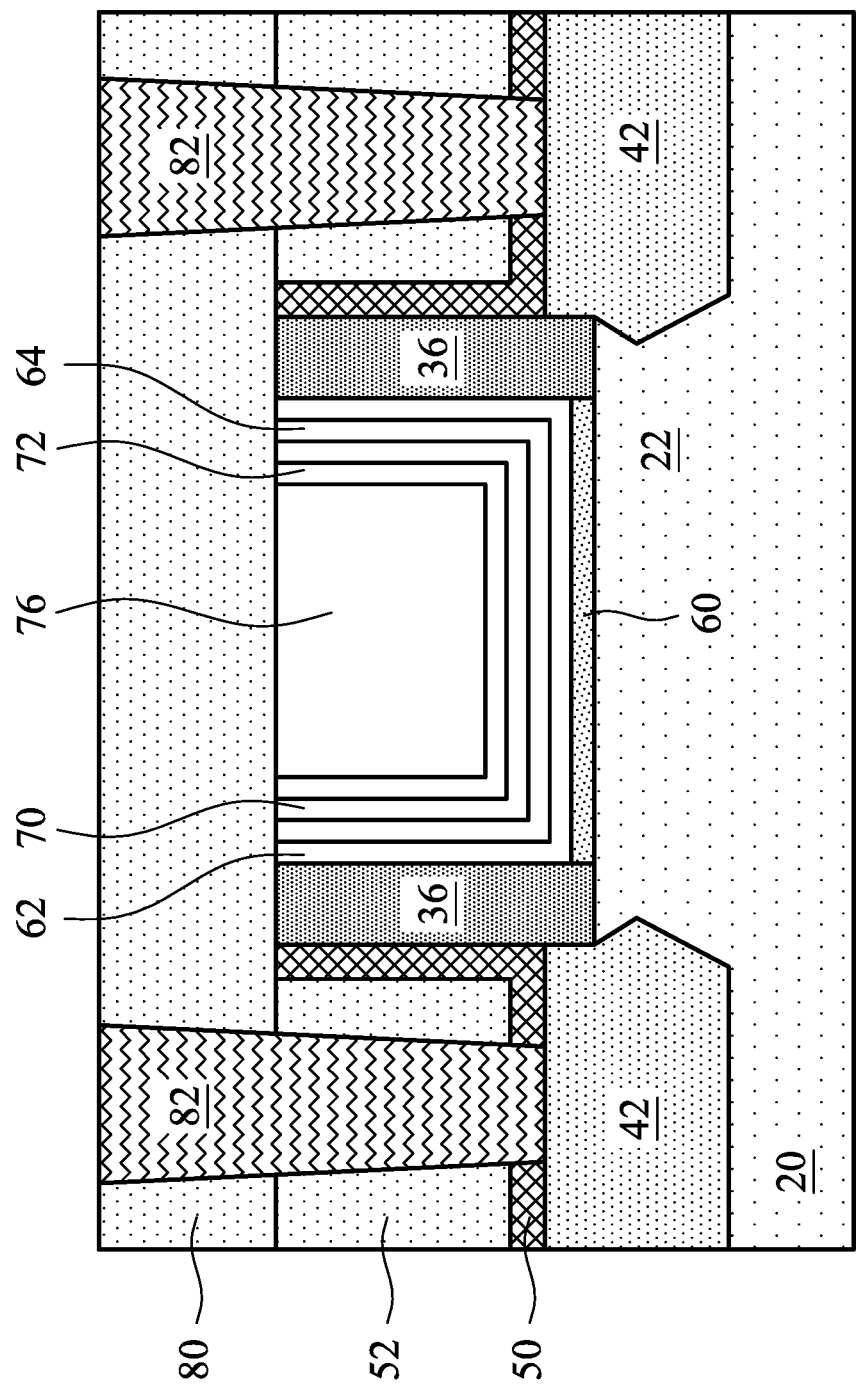

During the anneal 69 of operation 16 (and/or during the thermal nitridation at operation 14), metal from the high-k gate dielectric layer 62 and oxygen from the interfacial layer 60 and/or the high-k gate dielectric layer 62 diffuse to the silicon passivation layer 66 forming a metal silicate layer 70 at the interface of the silicon passivation layer 66 and the barrier layer 64. For example, for a high-k gate dielectric layer 62 comprising $LaO_x$ and/or $LaSi_xO_y$, the diffused lanthanum reacts with the silicon of the silicon passivation layer 66 and with the diffused oxygen at the silicon passivation layer 66 to form a lanthanum silicate ($LaSi_xO_y$). In another example, for a high-k gate dielectric layer 62 comprising $HfLa_xO_y$, the diffused lanthanum and diffused hafnium react with the silicon of the silicon passivation layer 66 and with the diffused oxygen at the silicon passivation layer 66 to form a hafnium lanthanum silicate ($HfLa_xSi_yO_z$). In certain embodiments, the metal silicate layer 70 comprises a high-k dielectric material. The high-k gate dielectric layer 62 and metal silicate layer 70 comprising a high-k dielectric material act as a gate dielectric between a metal fill layer 76 (as shown in FIG. 15) and the fin structure 22 to help reduce leakage current and to boost device performance.

Figure 12:
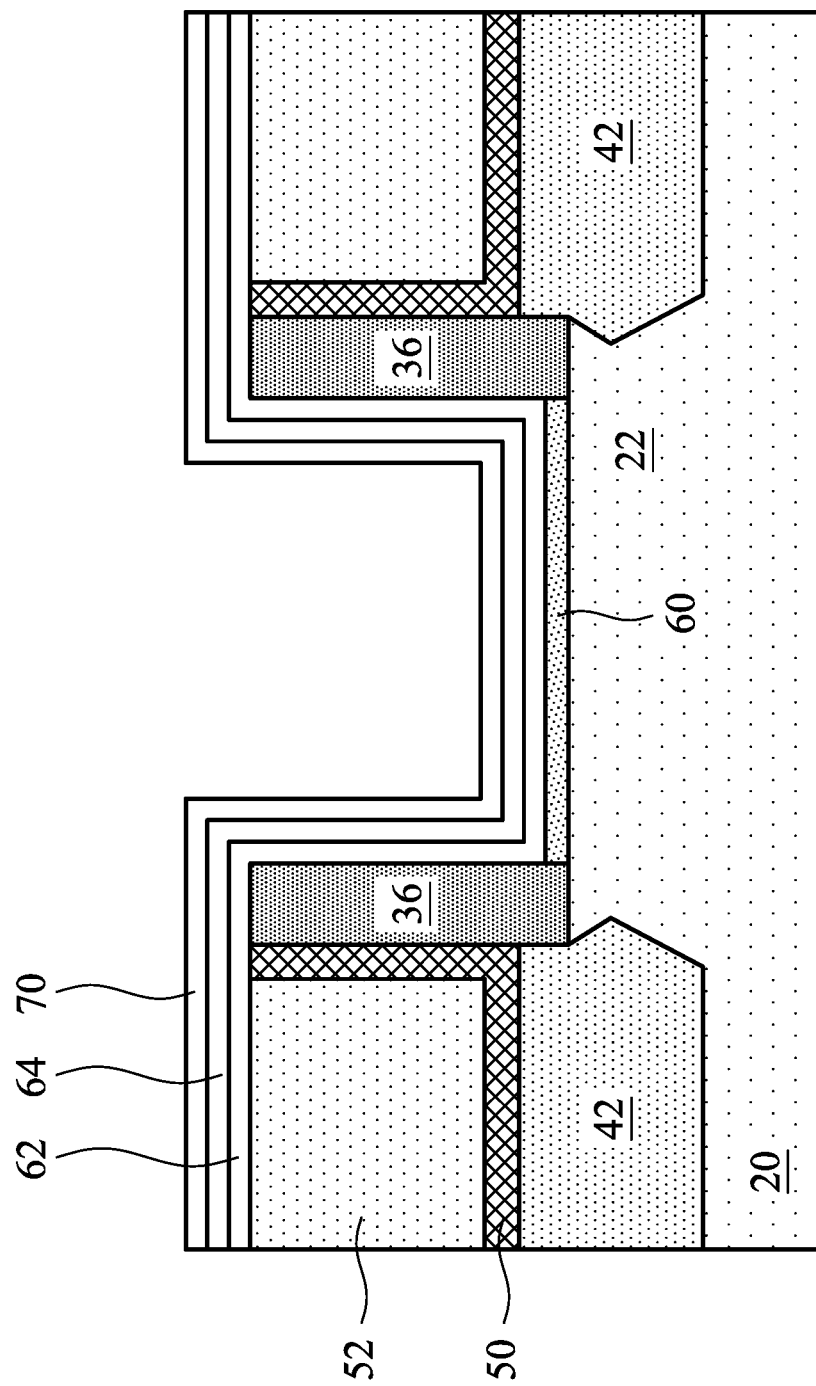

At operation 17 of the process 8 of FIG. 1, the capping layer 68 is removed as shown in FIG. 12. The capping layer may be removed by dry etching (such as plasma etching or reactive ion etching), wet etching, or other etching processes. For example, the etch process may be an isotropic etch process. In certain embodiments, the silicon passivation layer 66 is also removed at operation 17. For example, when the capping layer 68 comprises silicon, the silicon passivation layer 66 is removed at operation 17 since the capping layer 68 and the silicon passivation both comprise silicon. After operation 17, the metal silicate layer 70 remains over the barrier layer 64.

Figure 13:
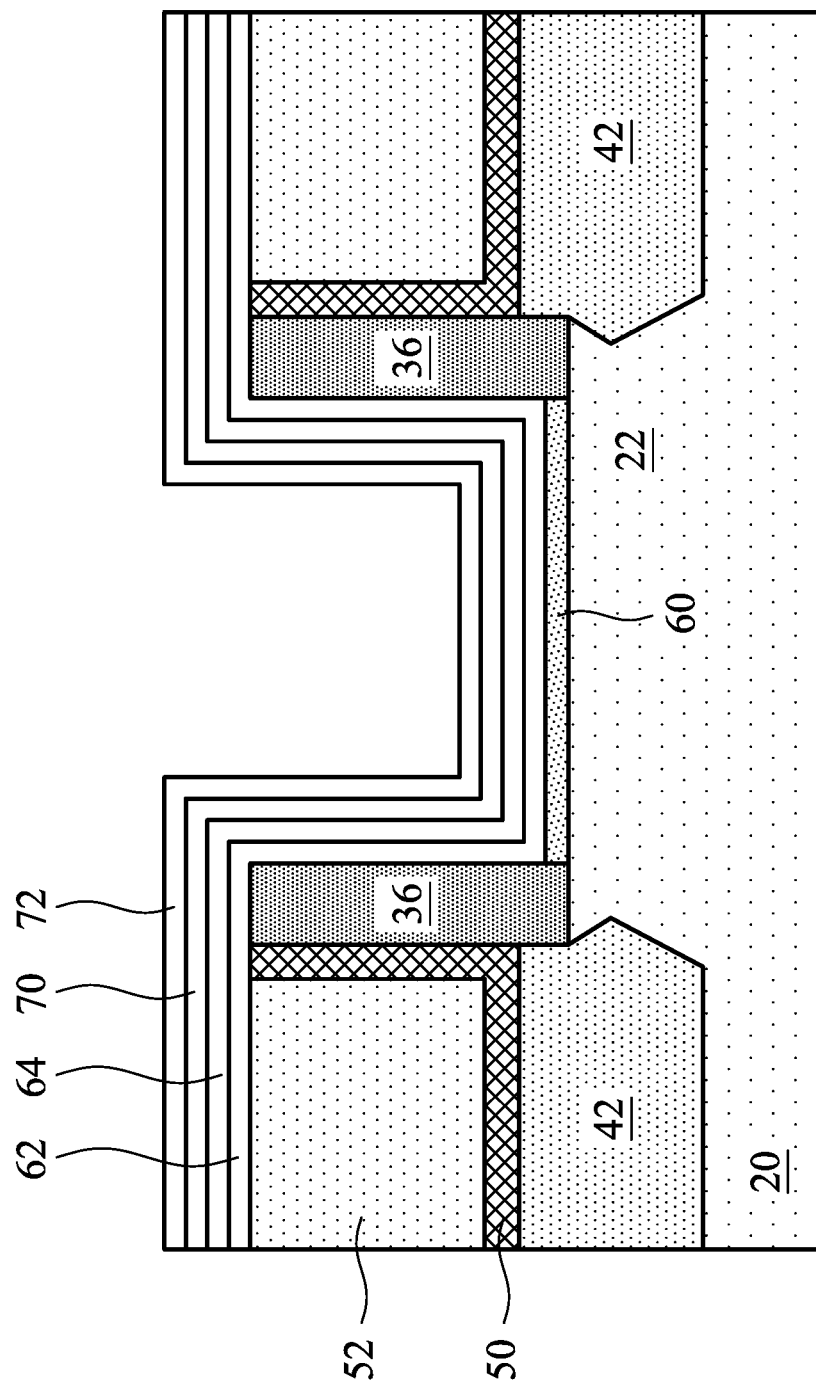

At operation 18 of the process 8 of FIG. 1, one or more work function metal layers 72 are deposited over the metal silicate layer 70 as shown in FIG. 13. One or more work function metal layers 72 are chosen to tune the work function value of the FinFET devices so that a desired threshold voltage Vt can be achieved in the transistor that is formed. Examples of a work function metal layer 72 for a gate structure for n-type FinFET devices include Ti, Ag, TaAl, TaAlC, TiAlN, TaC, TaCN, TaSiN, Mn, Zr, other suitable work function materials, or combinations thereof. Examples of a work function metal layer 72 for p-type FinFET devices include TiN, TaN, Ru, Mo, Al, WN, $ZrSi_2$, $MoSi_2$, $TaSi_2$, $NiSi_2$, WN, other suitable work function materials, or combinations thereof. The work function metal layer 72 may have a thickness in a range from about 20 angstroms to about 100 angstroms. The work function metal layer 72 may be conformally deposited, such as by CVD processes, including PECVD, MOCVD, ALD, cyclic deposition, or other suitable deposition processes.

Figure 14:
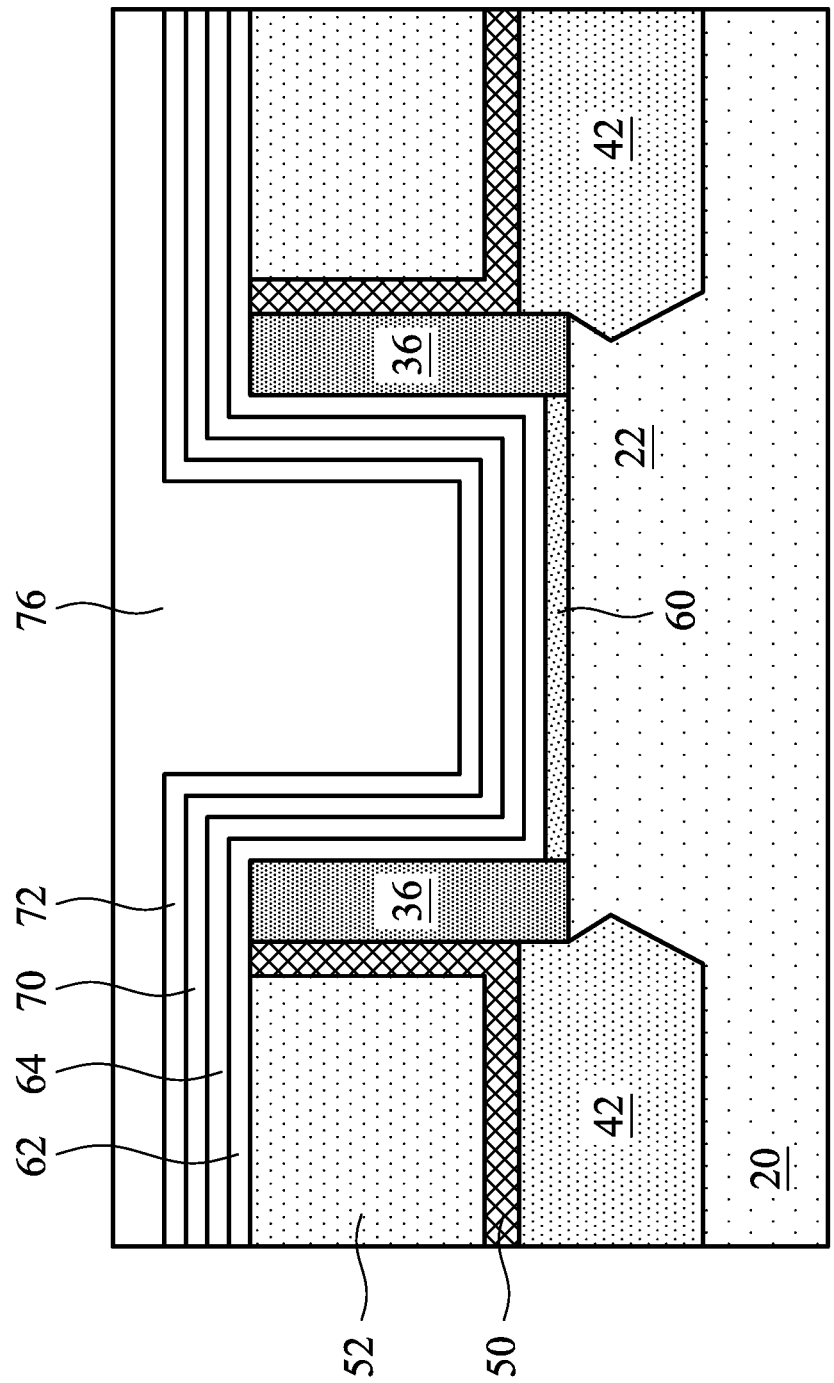

At operation 19 of the process 8 of FIG. 1, a metal fill layer 76 is deposited over the work function metal layer 72 as show in FIG. 14. In certain embodiments, the metal fill layer 76 may comprise tungsten, cobalt, aluminum, ruthenium, copper, other suitable metals, multi-layers thereof, a combination thereof, or the like. The metal fill layer 76 may be deposited by a suitable process, such as CVD, physical vapor deposition (PVD), sputtering, ALD, PECVD, plating, or other deposition processes.

The structure may be further processed as shown in FIG. 15. The high-k gate dielectric layer 62, the barrier layer 64, the metal silicate layer 70, the work function metal layer 72, and the metal fill layer 76 may be planarized, such as by a CMP process or another suitable planarization process. An ILD 80 may be deposited over the planarized structure by a deposition process, such as CVD, PVD, ALD, HDPCVD, MOCVD, or PECVD. For example, the ILD 80 may be silicon oxide, silicon nitride, silicon oxynitride, phosphosilicate glass (PSG), boro-silicate glass (BSG), boron-doped phospho-silicate glass (BPSG), or other dielectric layers. The ILD 80 may be patterned to form openings that are filled with metal, such as copper, tungsten, or other suitable metals, to form contacts 82 contacting the source/drain regions 42. The contacts 82 may be deposited by PVD, electrochemical deposition, CVD, combinations thereof, or other suitable deposition processes.

Figure 16:
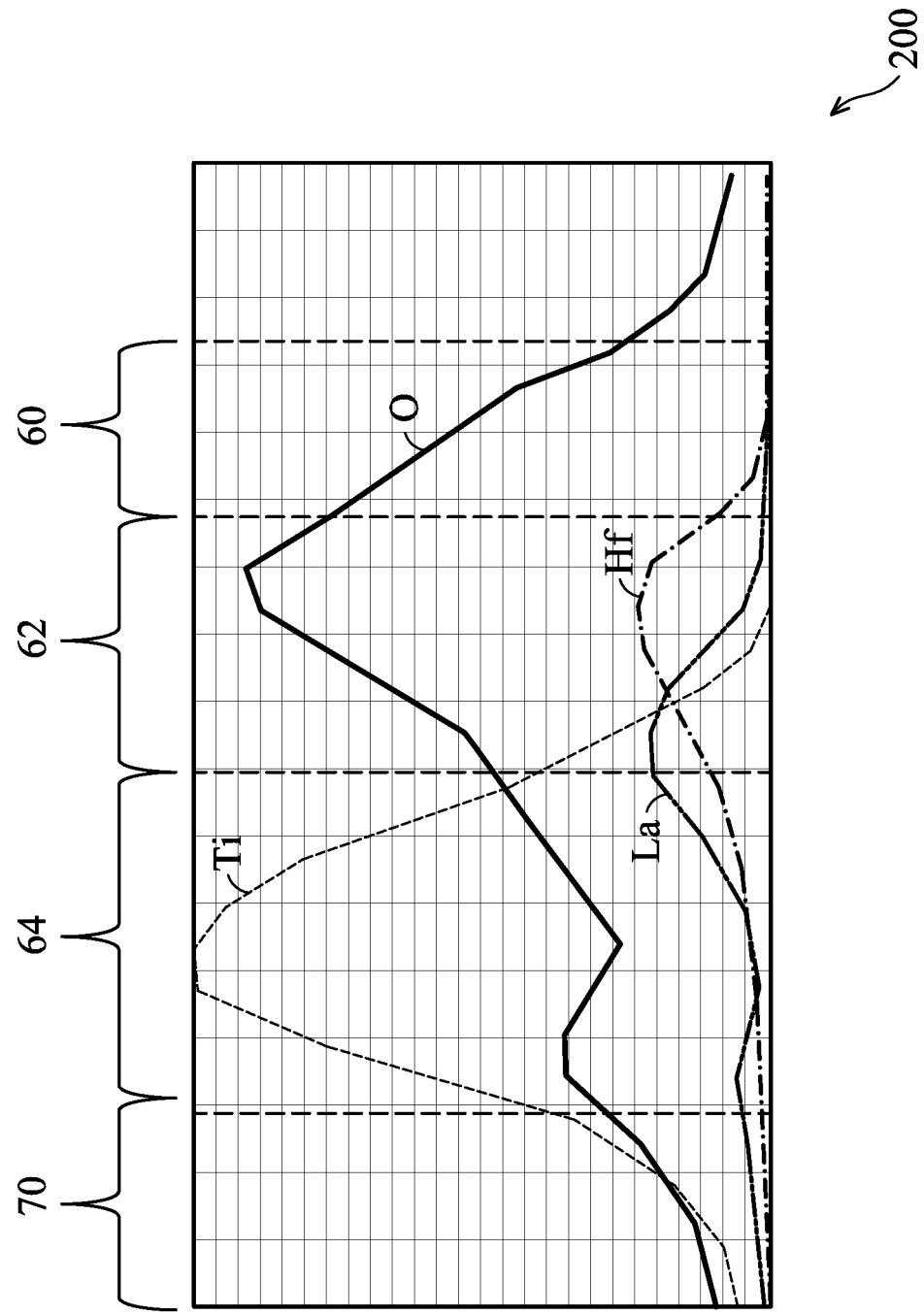
FIG. 16 is a graph of an atomic percent content in a high-k metal gate structure in accordance with some embodiments.

FIG. 16 is a graph 200 of an atomic percent content in a high-k metal gate structure, such as the structure of FIG. 15, in accordance with some embodiments. The high-k metal gate structure includes a interfacial layer 60 comprising silicon oxide, a high-k gate dielectric layer 62 comprising $HfLa_xO_y$, a barrier layer 64 comprising titanium nitride, and a metal silicate layer 70 comprising $HfLa_xSi_yO_z$. For ease of illustration, the atomic content of silicon and nitrogen is omitted from the graph 200. As shown in the graph 200, lanthanum and hafnium have diffused from the high-k gate dielectric layer 62 to form the metal silicate layer 70. The peak concentration of lanthanum and hafnium is in the $HfLa_xO_y$ high-k gate dielectric layer 62 in comparison to the silicon oxide interfacial layer 60, the titanium nitride barrier layer 64, or the $HfLa_xSi_yO_z$ metal silicate layer 70. Oxygen from the silicon oxide interfacial layer 60 and/or the $HfLa_xO_y$ high-k gate dielectric layer 62 has diffused to form the $HfLa_xSi_yO_z$ metal silicate layer 70 as well as forming titanium oxynitride within the titanium nitride barrier layer 64. In the embodiments as shown in the graph 200, the $HfLa_xO_y$ high-k gate dielectric layer 62 remains oxygen-rich. If the high-k gate dielectric layer 62 is not oxygen-rich than the dielectric constant of the high-k gate dielectric would be adversely lower. The oxygen content of the $HfLa_xO_y$ high-k gate dielectric layer 62 is higher than the oxygen content of the silicon oxide interfacial layer 60, the titanium nitride barrier layer 64, or the $HfLa_xSi_yO_z$ metal silicate layer 70.

In certain embodiments, a high-k metal gate structure comprises a high-k gate dielectric layer, a barrier layer over the high-k gate dielectric layer, a metal silicate layer over the barrier layer, a work function metal layer over the metal silicate layer, and a gate electrode over the work function metal layer. The metal silicate layer is formed through passivation or forming a silicon passivation layer over the barrier layer using a silicon precursor and through annealing of the metal gate structure through a post-metal anneal (e.g., in a thermal nitridation) after forming the barrier layer and/or a post capping layer anneal. In certain embodiments, the metal gate structure exhibits an increase in dielectric value along with a boost in device performance.

An embodiment is a method of semiconductor processing. The method includes depositing a high-k gate dielectric layer over a semiconductor fin. A barrier layer is deposited over the high-k gate dielectric layer. A silicon passivation layer is deposited over the barrier layer. A nitrogen treatment is performed on the silicon passivation layer. A capping layer is deposited over the silicon passivation layer. The capping layer is annealed.

Another embodiment is a device structure. The device structure includes a high-k gate dielectric layer over a semiconductor fin. A barrier layer is over the high-k gate dielectric layer. A metal silicate layer is over the barrier layer. A work function metal layer is over the metal silicate layer. A metal fill layer is over the work-function metal layer.

Yet another embodiment is another method of semiconductor processing. The method includes depositing a high-k gate dielectric layer comprising a metal oxide over a semiconductor fin. A barrier layer is deposited over the high-k gate dielectric layer. A silicon passivation layer is deposited over the barrier layer. The barrier layer and the silicon passivation layer are deposited in situ. A nitrogen treatment is performed on the silicon passivation layer. A capping layer is deposited over the silicon passivation layer. A metal silicate layer is formed by annealing the silicon passivation layer to diffuse a metal from the metal oxide of the high-k gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device structure comprising:
   a high-k gate dielectric layer over a semiconductor fin;
   a barrier layer over the high-k gate dielectric layer;
   a metal silicate layer over the barrier layer;
   a work function metal layer over the metal silicate layer; and
   a metal fill layer over the work function metal layer.

2. The device structure of claim 1, wherein the high-k gate dielectric layer comprises lanthanum.

3. The device structure of claim 1, wherein the barrier layer comprises titanium nitride.

4. The device structure of claim 3, wherein the barrier layer comprises titanium oxynitride.

5. The device structure of claim 1, wherein the metal silicate layer comprises lanthanum silicate.

6. The device structure of claim 1, further comprising an interfacial layer over the semiconductor fin, wherein the high-k gate dielectric layer is over the interfacial layer.

7. The device structure of claim 6, wherein the interfacial layer comprises a material selected from a group consisting essentially of silicon oxide, silicon oxynitride, and a combination thereof.

8. A device structure comprising:
   a high-k gate dielectric layer over a channel region, the high-k gate dielectric layer comprising an oxide of a first metal;
   a barrier layer over the high-k gate dielectric layer;
   a metal silicate layer over the barrier layer, the metal silicate layer comprising a silicate of the first metal;
   a work function metal layer over the metal silicate layer; and
   a metal layer over the work function metal layer.

9. The device structure of claim 8, wherein the high-k gate dielectric layer comprises hafnium lanthanum oxide and the metal silicate layer comprises hafnium lanthanum silicate.

10. The device structure of claim 9, wherein a peak concentration of hafnium in the high-k gate dielectric layer is greater than a peak concentration of hafnium in the metal silicate layer.

11. The device structure of claim 10, wherein a peak concentration of lanthanum in the high-k gate dielectric layer is greater than a peak concentration of lanthanum in the metal silicate layer.

12. The device structure of claim 8, wherein the barrier layer comprises a nitride.

13. The device structure of claim 12, wherein the barrier layer comprises titanium nitride or tantalum nitride.

14. The device structure of claim 8, wherein the high-k gate dielectric layer comprises lanthanum oxide or lanthanum silicate, and the metal silicate layer comprises lanthanum silicate.

15. The device structure of claim 8 further comprising an interfacial layer interposed between the high-k gate dielectric layer and the channel region, wherein the interfacial layer has a thickness in a range of 3.5 Å to 7 Å.

16. A device structure comprising:
   a high-k gate dielectric layer over a channel region, the high-k gate dielectric layer comprising an oxide;
   a barrier layer over the high-k gate dielectric layer;
   a metal silicate layer over the barrier layer, the metal silicate layer and the high-k gate dielectric layer comprising a first metal;
   a silicon layer over the metal silicate layer;
   a work function metal layer over the silicon layer; and
   a metal layer over the work function metal layer.

17. The device structure of claim 16, wherein the first metal comprises hafnium.

18. The device structure of claim 17, wherein a concentration of hafnium is higher in the high-k gate dielectric layer than in the barrier layer and the metal silicate layer.

19. The device structure of claim 16, wherein the first metal comprises lanthanum.

20. The device structure of claim 16, wherein the high-k gate dielectric layer comprises lanthanum and hafnium, wherein the metal silicate layer comprises lanthanum and hafnium.

* * * * *